United States Patent
Tai et al.

(10) Patent No.: US 7,838,901 B2
(45) Date of Patent: Nov. 23, 2010

(54) SINGLE-CHIP COMMON-DRAIN JFET DEVICE AND ITS APPLICATIONS

(75) Inventors: Liang-Pin Tai, Tainan (TW); Jing-Meng Liu, Hsinchu (TW); Hung-Der Su, Luju Township, Kaohsiung County (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 12/385,719

(22) Filed: Apr. 17, 2009

(65) Prior Publication Data

US 2009/0201078 A1    Aug. 13, 2009

Related U.S. Application Data

(62) Division of application No. 11/165,028, filed on Jun. 24, 2005, now Pat. No. 7,535,032.

(30) Foreign Application Priority Data

Jun. 25, 2004  (TW)  ............................ 93118436 A

(51) Int. Cl.
    *H01L 29/74*    (2006.01)
    *H01L 31/111*   (2006.01)

(52) U.S. Cl. ................. 257/134; 257/135; 257/E29.314

(58) Field of Classification Search ................. 257/134, 257/135, E29.314
    See application file for complete search history.

(56) References Cited

U.S. PATENT DOCUMENTS

| 5,396,085 A * | 3/1995 | Baliga ........................ 257/77 |
| 2005/0057228 A1* | 3/2005 | Shih ........................... 323/222 |

\* cited by examiner

*Primary Examiner*—Phat X Cao
(74) *Attorney, Agent, or Firm*—Rosenberg, Klein & Lee

(57) ABSTRACT

A single-chip common-drain JFET device comprises a drain, two gates and two source arranged such that two common-drain JFETs are formed therewith. Due to the two JFETs merged within a single chip, no wire bonding connection is needed therebetween, thereby without parasitic inductance and resistance caused by bonding wire, and therefore improving the performance and reducing the package cost. The single-chip common-drain JFET device may be applied in buck converter, boost converter, inverting converter, switch, and two-step DC-to-DC converter to improve their performance and efficiency. Alternative single-chip common-drain JFET devices are also provided for current sense or proportional current generation.

1 Claim, 12 Drawing Sheets

SINGLE-CHIP COMMON-DRAIN JFET DEVICE AND ITS APPLICATIONS

RELATED APPLICATIONS

This application is a Divisional patent application of application Ser. No. 11/165,028, filed on 24 Jun. 2005 now U.S. Pat. No. 7,535,032. The entire disclosure of the prior application, Ser. No. 11/165,028, from which an oath or declaration is supplied, is considered a part of the disclosure of the accompanying Divisional application and is hereby incorporated by reference.

FIELD OF THE INVENTION

The present invention is related generally to a novel electronic device and more particularly to a single-chip common-drain JFET device and its applications.

BACKGROUND OF THE INVENTION

As shown in FIG. 1, in a conventional DC-to-DC converter 10 to convert an input voltage VIN to an output voltage VOUT, two Metal-Oxide-Semiconductor Field-Effect Transistors (MOSFETS) 12 and 14 are employed for the high-side and low-side power switches in a power stage to be alternatively switched by control signals UG and LG provided by a controller 16 to regulate a current I flowing through an inductor L to charge a capacitor C to produce the output voltage VOUT. When integrated circuit scaled down, MOSFET will have too large conductive resistance to satisfy the designers' requirements and therefore, it is intended for other element having lower conductive resistance for the power switches for less power loss within the switches. Junction Field-Effect Transistor (JFET) is potential candidate as semiconductor switch with lower conductive resistance and lower cost. In U.S. Pat. Nos. 6,580,252 and 6,356,059 to Yu, normally-off enhancement mode JFET is used for the power switches of boost converter and buck converter to reduce the voltage drop loss at ON-state and the state transition time. However, these arts are still not perfect enough. On the other hand, the MOSFETs 12 and 14 of the converter 10 are required to be individually formed in two chips for the heat dissipation issue and therefore, bonding wire of package is needed for the electrically connection between the MOSFETs 12 and 14, thereby causing parasitic inductance and resistance to degrade the switching performance and efficiency.

Therefore, it is desired an electronic device with lower conductive resistance than that of MOSFET and without bonding wire of package between switches.

SUMMARY OF THE INVENTION

One object of the present invention is directed to a single-chip common-drain JFET device and its applications. The single-chip common-drain JFET device has lower conductive resistance than that of MOSFET to reduce power loss within switches, and needs no bonding wire for electrical connection between the JFETs in the device, thereby improving the circuit performance and efficiency.

According to the present invention, a single-chip common-drain JFET device comprises a drain, two gates and two source arranged such that two common-drain JFETs are formed therewith. The current carriers in a JFET are majority carriers which result in lower conductive resistance than a MOSFET, and therefore using JFET as switch will result in less power loss than MOSFET switch. In other words, the heat generated by the current flowing through a JFET is less, and more JFETs can be integrated in a same chip to reduce the package cost. JFET structure is easy to combine multiple JFETs within one chip without side effect even under high current applications. Furthermore, integration of common-drain JFETs in a same chip will have no bonding wire for electrical connection between the JFETs in the same chip, thereby reducing package cost. The switching performance of the JFETs with common-drain within a single chip is also improved since the parasitic inductance and resistance caused by bonding wire of package are avoided. The single-chip common-drain JFET device according to the present invention may be applied in power circuits, such as buck converter, boost converter, inverting converter, switch, and two-step DC-to-DC converter, to improve their circuit performance and efficiency.

Alternatively, a single-chip common-drain JFET device according to the present invention further comprises a third source in conjunction with the first gate and drain to form a third JFET, such that the source currents at the first and third sources will be proportional to each other and current sense may be achieved therewith.

Alternatively, a single-chip common-drain JFET device according to the present invention further comprises a third source in conjunction with the first gate and drain to form a third JFET and a fourth source in conjunction with the second gate and drain to form a fourth JFET, such that the source currents at the first and third sources will be proportional to each other and the source currents at the second and fourth sources will be proportional to each other, and current sense may be achieved therewith.

Alternatively, a single-chip common-drain JFET device according to the present invention comprises a drain, a gate, and two sources arranged such that two JFETs are formed therewith. The source currents at the two sources will be proportional to each other, and therefore the single-chip common-drain JFET device may be used for current sense.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
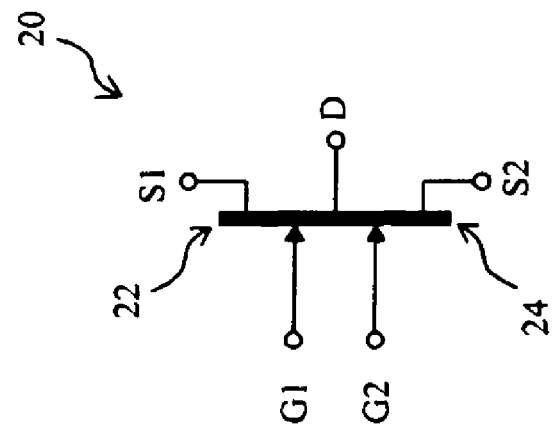
FIG. 2 shows a first embodiment of a single-chip common-drain JFET device according to the present invention.
Figure 1:
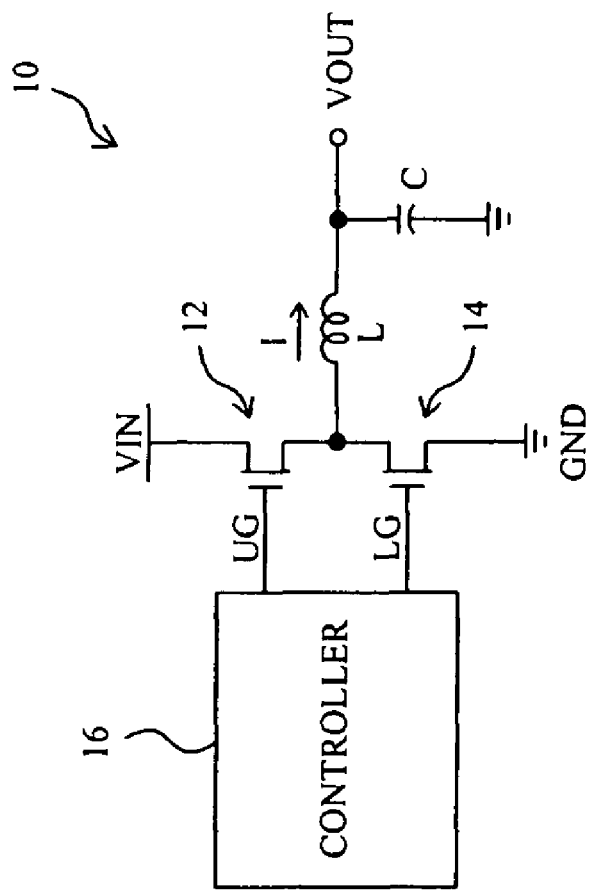
FIG. 1 shows a conventional DC-to-DC converter.

For a first embodiment according to the present invention, FIG. 2 shows a single-chip common-drain JFET device 20 that comprises a drain D, two separated gates G1 and G2, and two separated sources S1 and S2 arranged such that the source S1, gate G1 and drain D form a JFET 22, and the source S2, gate G2 and drain D form a JFET 24. Since the common-drain JFETs 22 and 24 are merged in a same chip, it does not need wire bonding connection between the JFETs 22 and 24 as that for the MOSFETs 12 and 14 of FIG. 1, and there are no parasitic inductance and resistance caused by the bonding wire between the drains of the JFETs 22 and 24. As a result, the switching performance of the JFETs 22 and 24 is improved, and the package cost for the JFETs 22 and 24 is reduced. In this embodiment, both the JFETs 22 and 24 are depletion mode JFETs, in another embodiment, however, the JFETs 22 and 24 may be both enhancement mode JFETs, or one depletion mode JFET and one enhancement mode JFET.

Figure 3:
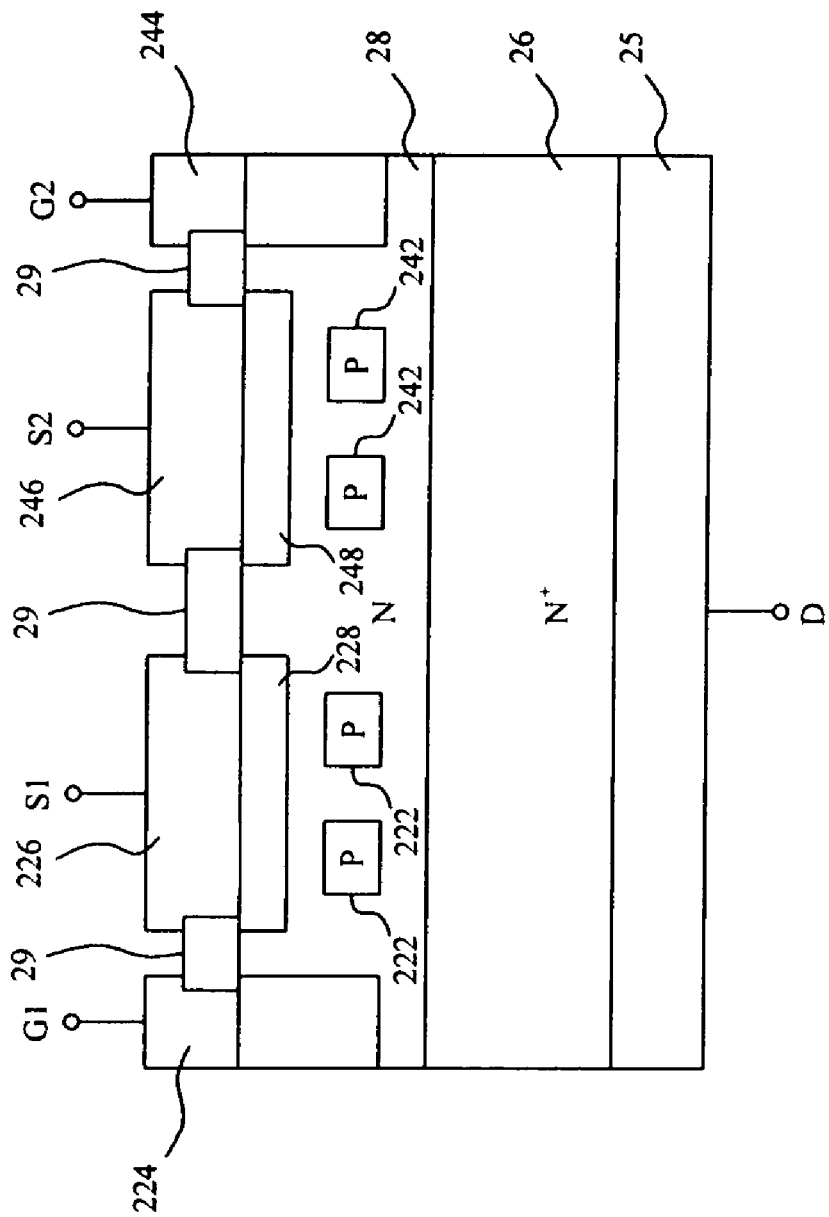
FIG. 3 shows an embodiment of a structure of the single-chip common-drain JFET device shown in FIG. 2.

FIG. 3 shows an embodiment of a structure of the single-chip common-drain JFET device 20 implemented with N-channels for illustration, in which an N-type epitaxial layer 28 is formed on one side of a N+ substrate 26 to provide vertical channels, a conductor layer 25 is formed on the opposite side of the substrate 26 to serve as the drain D, P-type conductor layers 222 and 242 in the epitaxial layer 28 are electrically connected, respectively, to the conductor layers 224 and 244 serving the gates G1 and G2 above the epitaxial layer 28, conductor layers 226 and 246 serving the sources S1 and S2 above the epitaxial layer 28 are electrically connected to conductor layers 228 and 248, respectively, and an oxide layer 29 is formed for insulations between the conductor layers 224, 226, 246, and 244.

Figure 4:
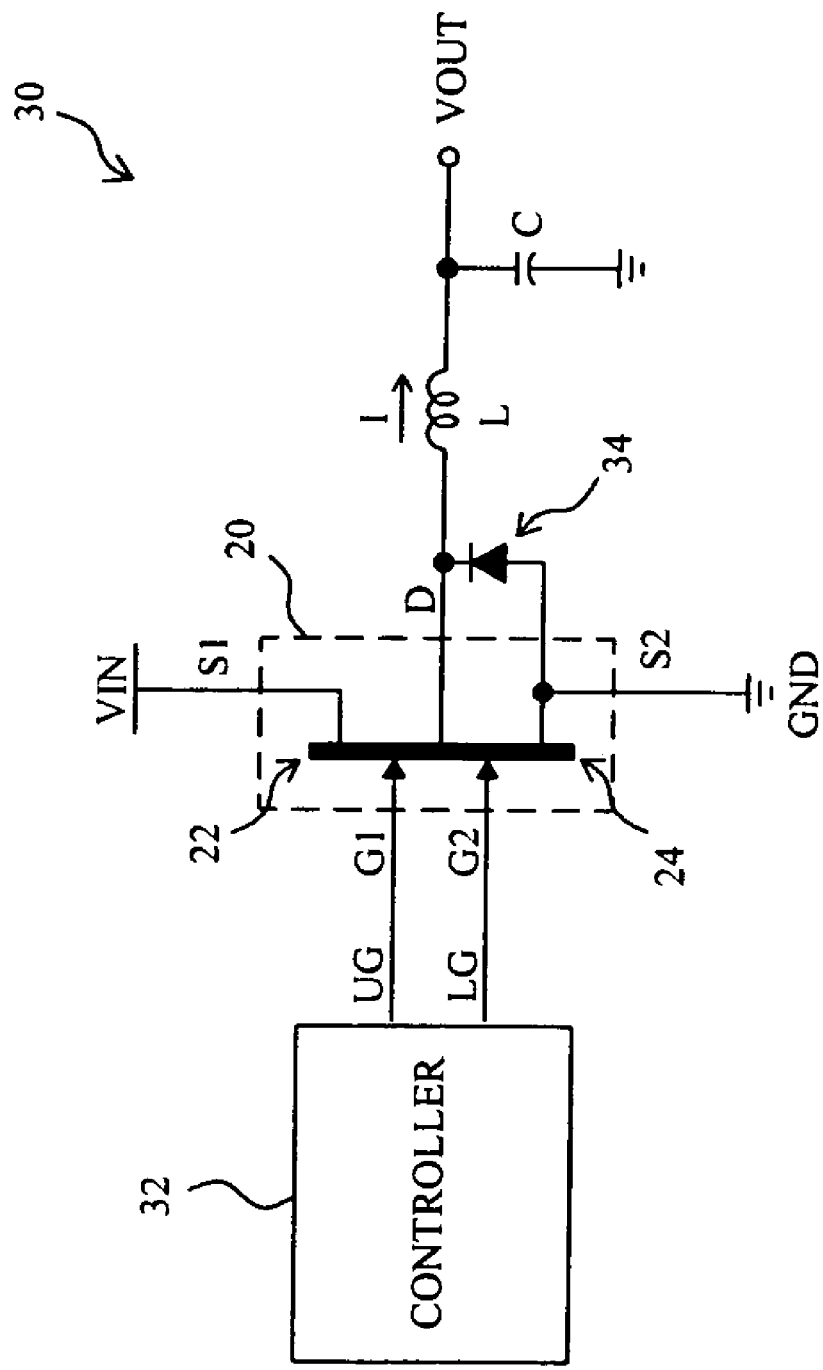
FIG. 4 shows a buck converter implemented with a single-chip common-drain JFET device according to the present invention.

FIG. 4 shows a buck converter 30 implemented with the single-chip common-drain JFET device 20, in which the source S1 is coupled with an input voltage VIN, the source S2 is grounded, the drain D is coupled to an output VOUT through an inductor L, and the gates G1 and G2 are coupled with control signals UG and LG provided by a controller 32 for alternatively switching the common-drain JFETs 22 and 24 to regulate a current I flowing through the inductor L to charge a capacitor C to produce an output voltage VOUT. Furthermore, for the inductor current sustained when both the JFETs 22 and 24 turn off, a diode 34 is coupled between the drain D and source S2. In another embodiment, a parasitic diode within the chip of the device 20 may be used for the diode 34.

Figure 5:
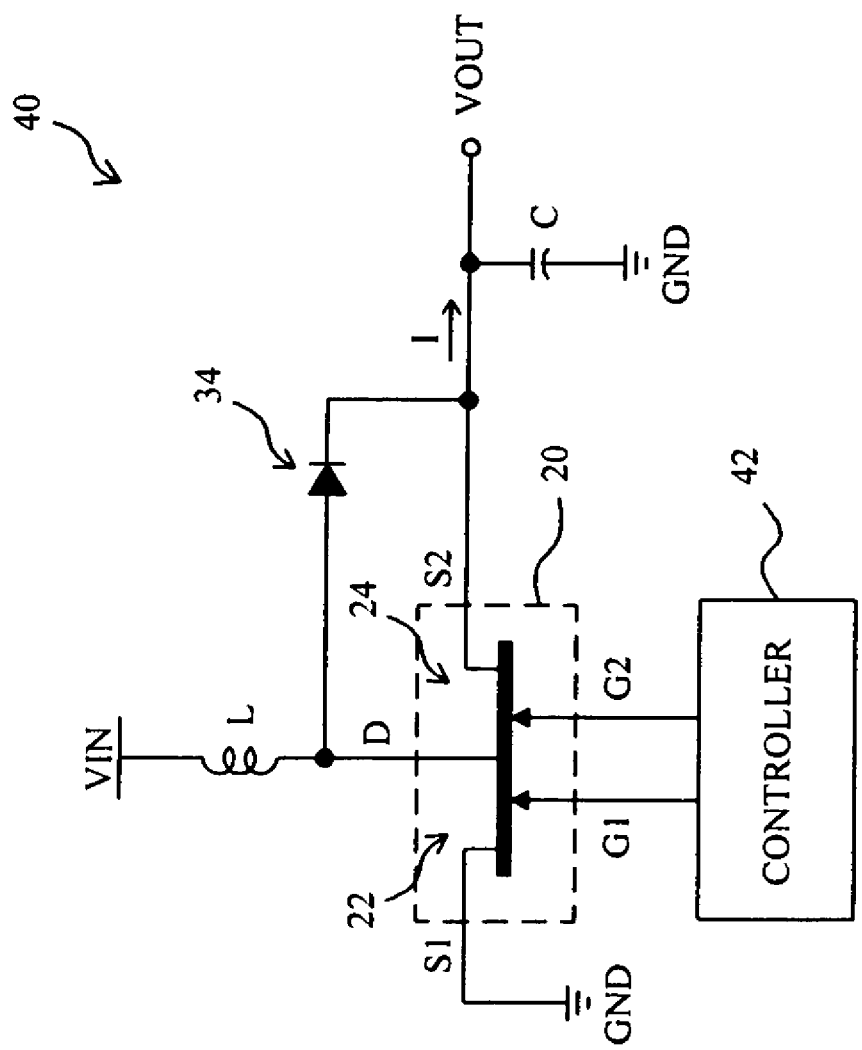
FIG. 5 shows a boost converter implemented with a single-chip common-drain JFET device according to the present invention.

FIG. 5 shows a boost converter 40 implemented with the single-chip common-drain JFET device 20, in which the source S1 is grounded, the source S2 is coupled to an output VOUT, the drain D is coupled to an input voltage VIN through an inductor L, and the gates G1 and G2 are coupled to a controller 42 for alternatively switching the common-drain JFETs 22 and 24 to regulate a current I to charge a capacitor C to produce an output voltage VOUT. Furthermore, for the inductor current sustained when both the JFETs 22 and 24 turn off, a diode 34 is coupled between the drain D and source S2. In another embodiment, a parasitic diode within the chip of the device 20 may be used for the diode 34.

Figure 6:
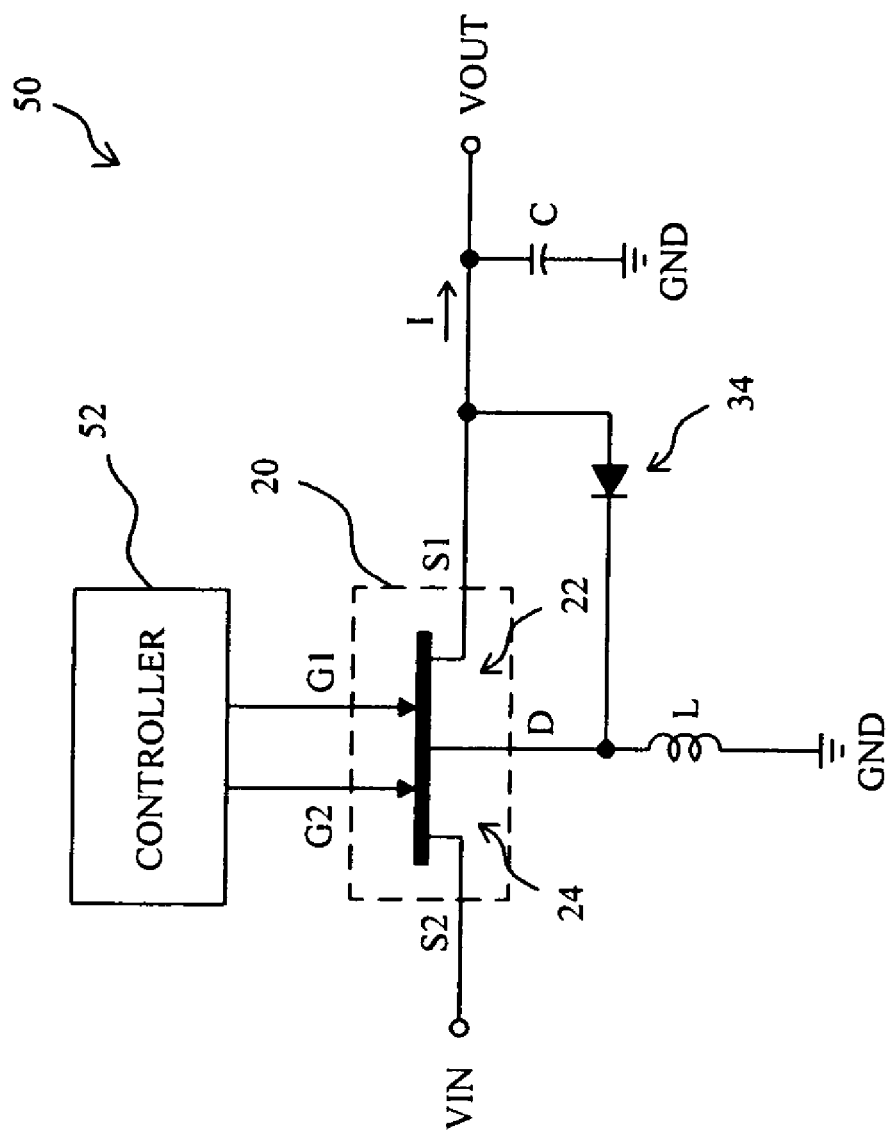
FIG. 6 shows a inverting converter implemented with a single-chip common-drain JFET device according to the present invention.

FIG. 6 shows an inverting converter 50 implemented with the single-chip common-drain JFET device 20, in which the source S1 is coupled to an output VOUT, the source S2 is coupled with an input voltage VIN, the drain D is grounded through an inductor L, and the gates G1 and G2 are coupled to a controller 52. When the JFET 22 turns off and the JFET 24 turns on, the inductor L is storing energy from the input voltage VIN, until the JFET 22 turns on and the JFET 24 turns off, the inductor L releases the stored energy to produce a current I to charge a capacitor C to produce an output voltage VOUT whose waveform is inversely to that of the input voltage VIN. Furthermore, for the inductor current sustained when both the JFETs 22 and 24 turn off, a diode 34 is coupled between the drain D and source S1. In another embodiment, a parasitic diode within the chip of the device 20 may be used for the diode 34.

Figure 7:
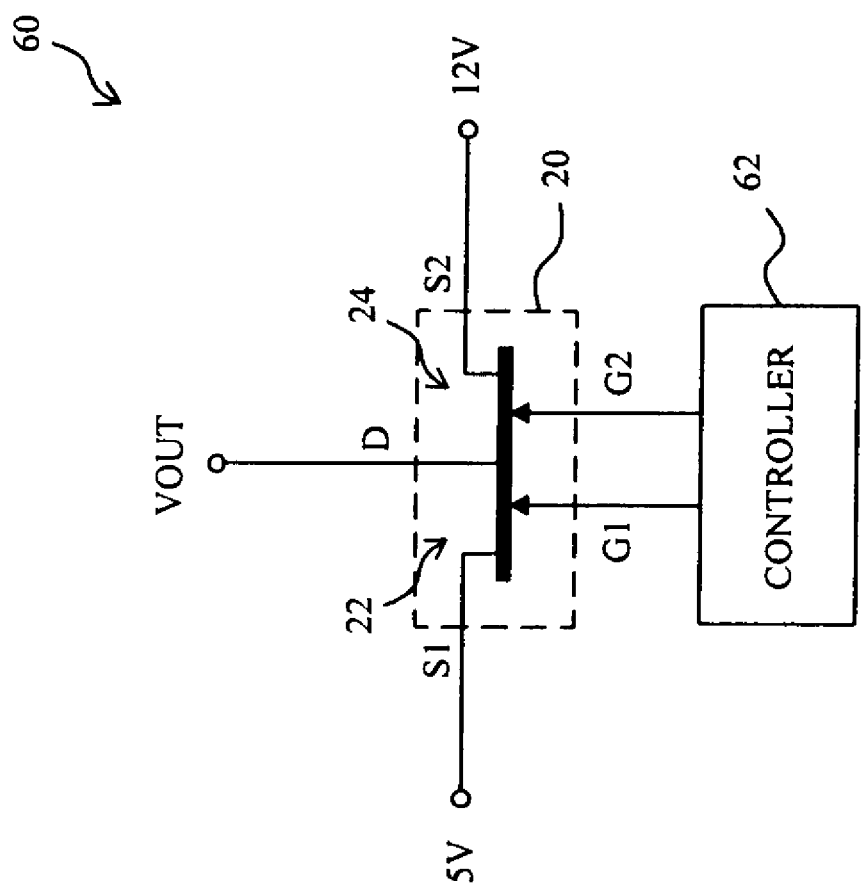
FIG. 7 shows a switch implemented with a single-chip common-drain JFET device according to the present invention.

FIG. 7 shows a switch 60 implemented with the single-chip common-drain JFET device 20, in which the source S1 is coupled with a supply voltage of 5V, the source S2 is coupled with a supply voltage of 12V, the drain D is coupled to an output VOUT, and the gates G1 and G2 are coupled to a controller 62 for switching the common-drain JFETs 22 and 24 to switch the output voltage VOUT between 5V and 12V.

Figure 8:
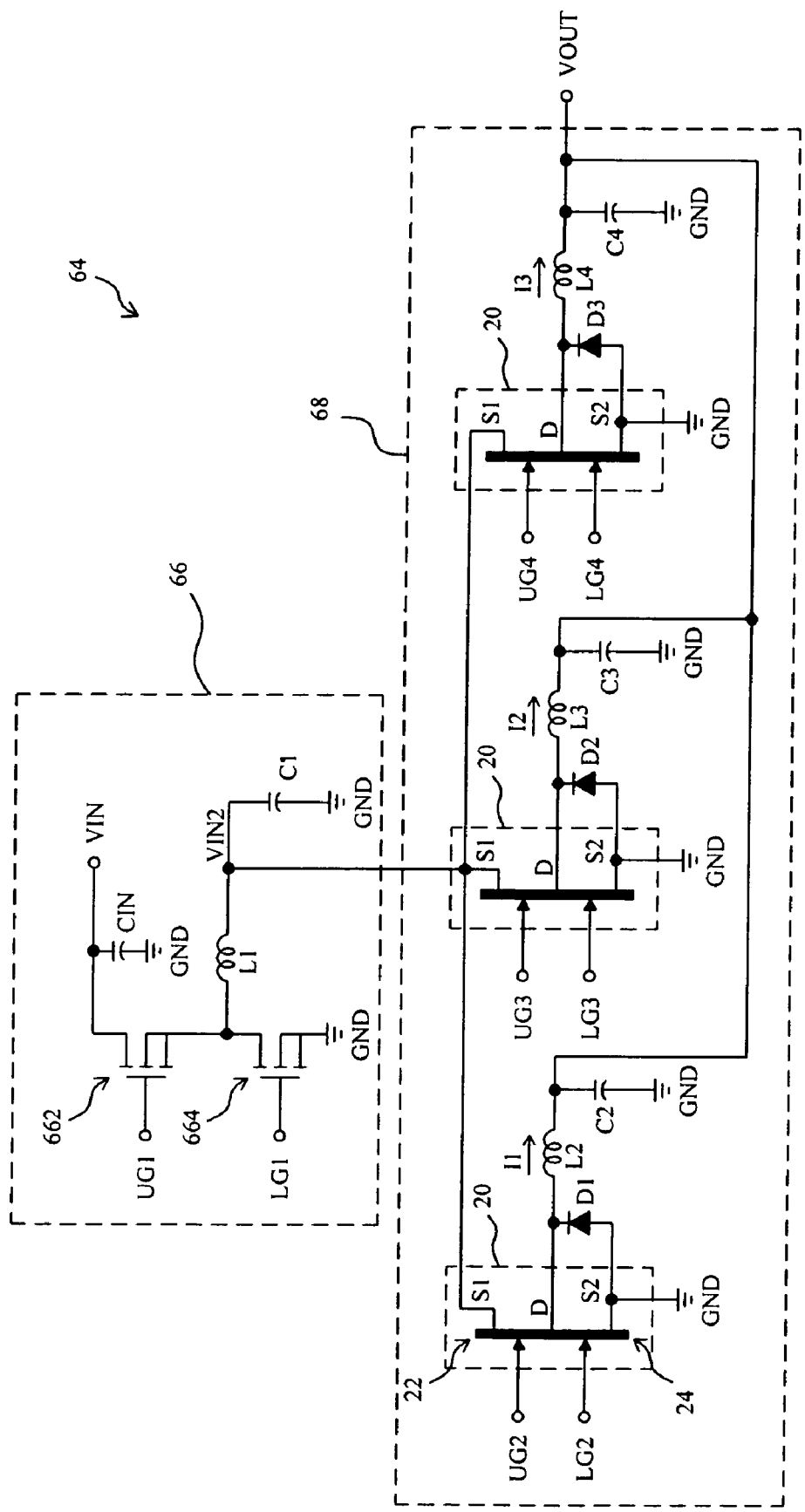
FIG. 8 shows a two-step DC-to-DC converter implemented with single-chip common-drain JFET devices according to the present invention.

FIG. 8 shows a two-step DC-to-DC converter 64 implemented with the single-chip common-drain JFET device 20, in which a first converting stage 66 includes MOSFETs 662 and 664 alternatively switched by control signals UG1 and LG1 to convert an input voltage VIN to a regulated voltage VIN2 for a second converting stage 68, and the second converting stage 68 includes several switching apparatus each comprising a single-chip common-drain JFET device 20 coupled between the voltage VIN2 and ground GND, and switched by control signals UG2 and LG2, UG3 and LG3, and UG4 and LG4, to regulate currents I1, I2 and I3 flowing through inductors L2, L3 and L4 to charge capacitors C2, C3 and C4 to produce an output voltage VOUT. For the inductor currents sustained when both the common-drain JFETs 22 and 24 of each respective device 20 turn off, diodes D1, D2 and D3 are coupled between the drain D and source S2 of the respective device 20. In another embodiment, a parasitic diode within the chip of the respective device 20 may be used for the diode D1, D2 or D3. In this embodiment 64, by using the single-chip common-drain JFET devices 20 for the switching apparatus in the second converting stage 68, there are no parasitic inductance and resistance caused by the bonding wire between the common-drain JFETs 22 and 24 of the respective device 20. For the first converting stage 66 could completely turn off the current supplied to the devices 20, each of the device 20 may employ two normally-on JFETs for the common-drain JFETs 22 and 24 to further reduce the conductive resistance thereof, and therefore the two-step DC-to-DC converter 64 will have better conversion efficiency due to less power loss.

Figure 10:
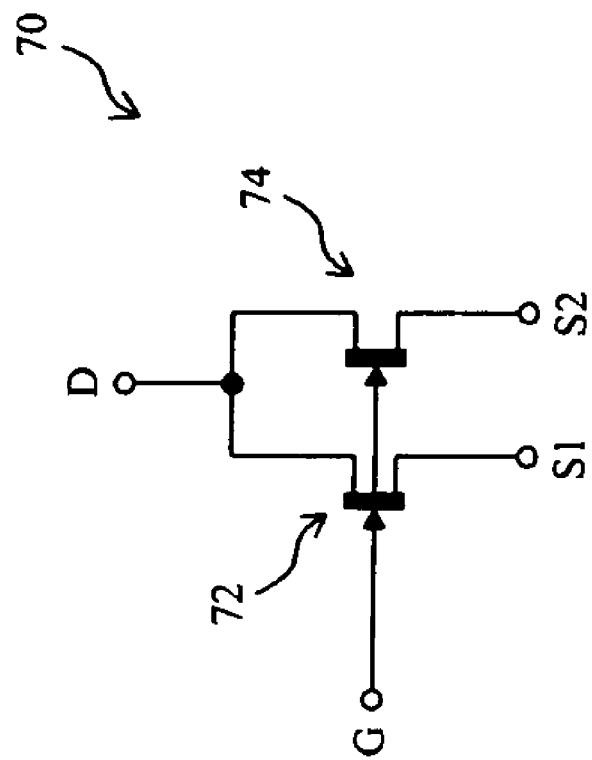
FIG. 10 shows an equivalent circuit of the single-chip common-drain JFET device shown in FIG. 9.
Figure 9:
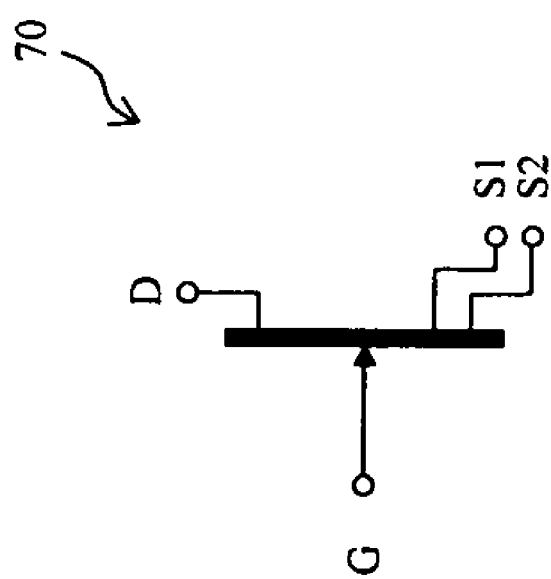
FIG. 9 shows a second embodiment of a single-chip common-drain JFET device according to the present invention.
Figure 11:
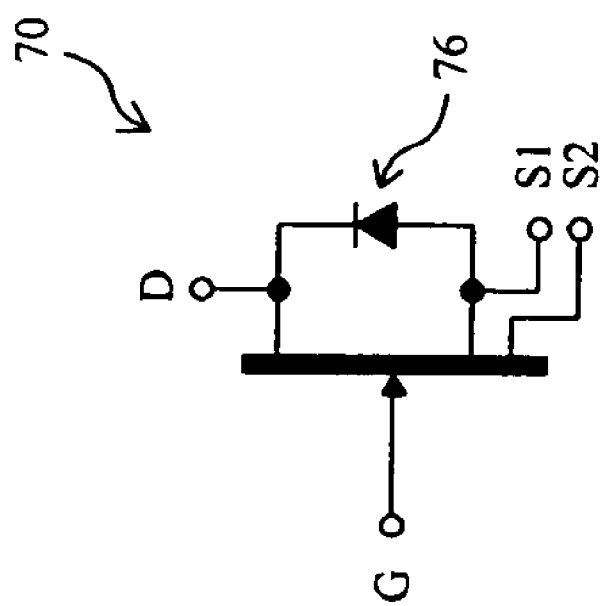
FIG. 11 shows a third embodiment of a single-chip common-drain JFET device according to the present invention.

FIG. 9 shows a single-chip common-drain JFET device 70 according to the present invention, which comprises a drain D, a gate G, and two separated sources S1 and S2 arranged such that two common-drain and common-gate JFETs 72 and 74 are formed therewith, as shown in FIG. 10. Due to the common-drain and common-gate of the JFETs 72 and 74, the source currents at S1 and S2 will have a ratio the same as the size ratio of the JFETs 72 and 74, and therefore the device 70 may be used for a current sensor. The JFETs 72 and 74 are easy to match to each other since they are formed within a single chip, and precise sense may be achieved accordingly. For other applications, as shown in FIG. 11, a diode 76 is coupled between the drain D and source S1 for a current sustained at the drain D when both the JFETs 72 and 74 turn off. A parasitic diode within the chip of the device 70 may be used for the diode 76. In the device 70, both the JFETs 72 and 74 are depletion mode JFETs, in another embodiment, however, the JFETs 72 and 74 may be enhancement mode JFETs.

Figure 12:
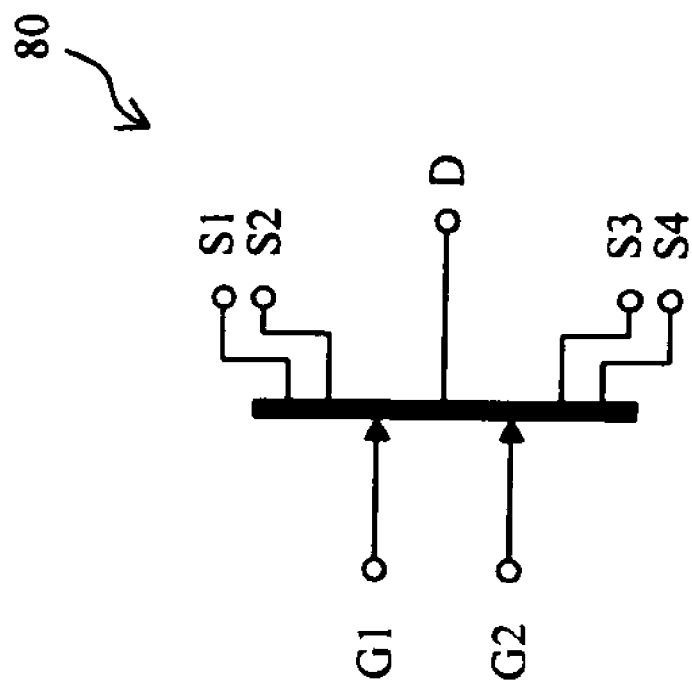
FIG. 12 shows a fourth embodiment of a single-chip common-drain JFET device according to the present invention.
Figure 14:
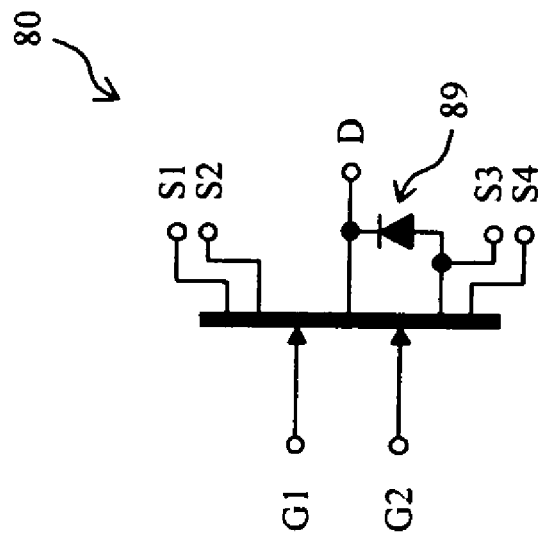
FIG. 14 shows a fifth embodiment of a single-chip common-drain JFET device according to the present invention.
Figure 13:
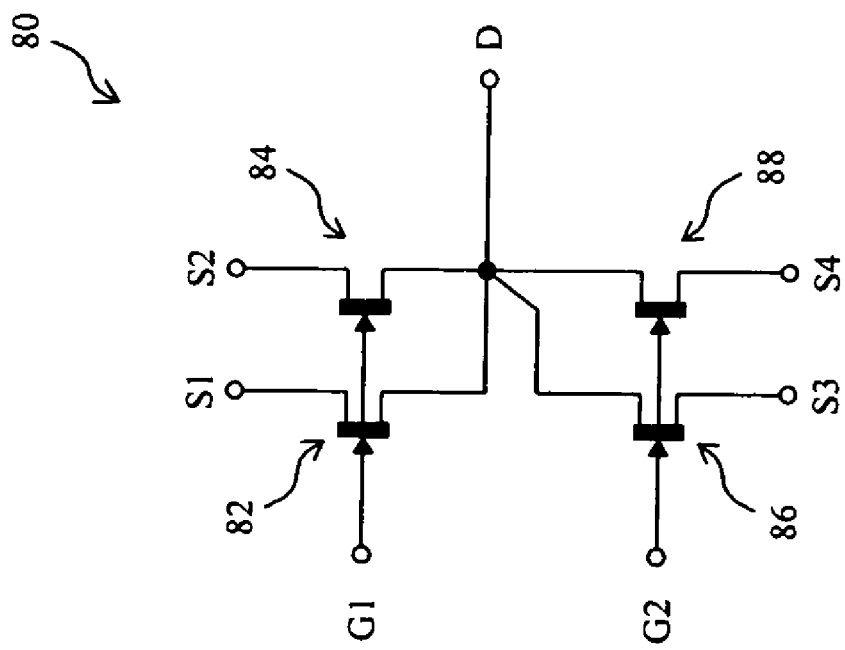
FIG. 13 shows an equivalent circuit of the single-chip common-drain JFET device shown in FIG. 12.

FIG. 12 shows a single-chip common-drain JFET device 80 according to the present invention, which comprises a drain D, two separated gates G1 and G2, and four separated sources S1-S4 arranged such that four common-drain JFETs 82-88 are formed therewith, as shown in FIG. 13. Due to the common-drain and common-gate of the JFETs 82 and 84, the source currents at S1 and S2 will have a ratio the same as the size ratio of the JFETs 82 and 84. Likewise, due to the common-drain and common-gate of the JFETs 86 and 86, the source currents at S3 and S4 will have a ratio the same as the size ratio of the JFETs 86 and 88. With the device 80, switching apparatus and proportional current generation may be obtained. For other applications, as shown in FIG. 14, a diode 89 is coupled between the drain D and source S3 for a current sustained at the drain D when all the JFETs 82-88 turn off. A parasitic diode within the chip of the device 80 may be used for the diode 89. In the device 80, all the JFETs 82-88 are depletion mode JFETs, in another embodiment, however, the JFETs 82-88 may be all enhancement mode JFETs, or a pair of depletion mode JFETs and a pair of enhancement mode JFETs.

Figure 16:
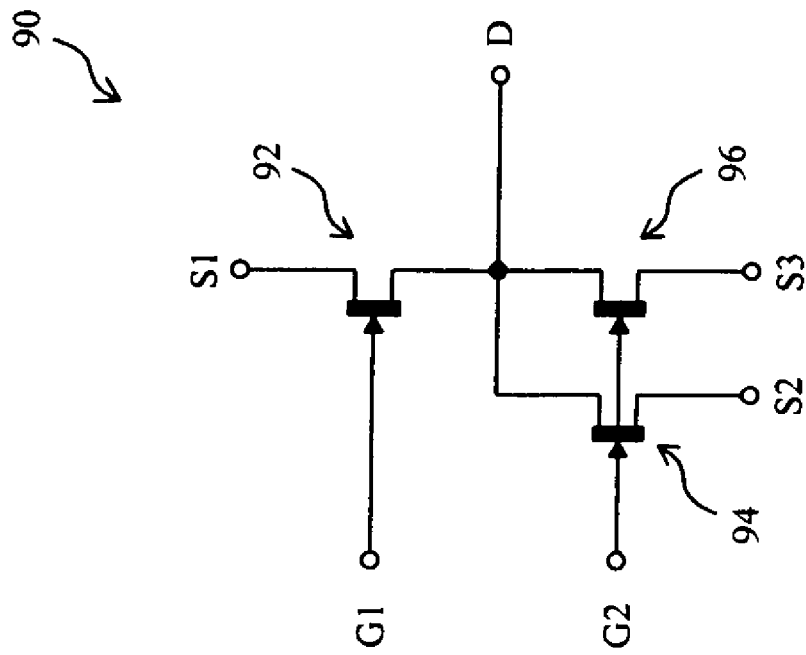
FIG. 16 shows an equivalent circuit of the single-chip common-drain JFET device shown in FIG. 15.
Figure 15:
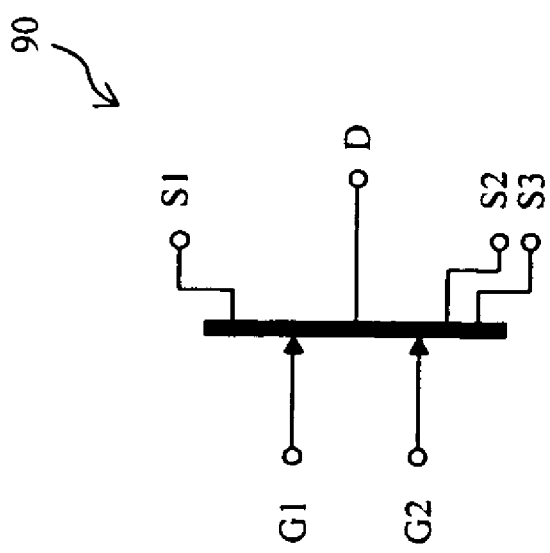
FIG. 15 shows a sixth embodiment of a single-chip common-drain JFET device according to the present invention.
Figure 17:
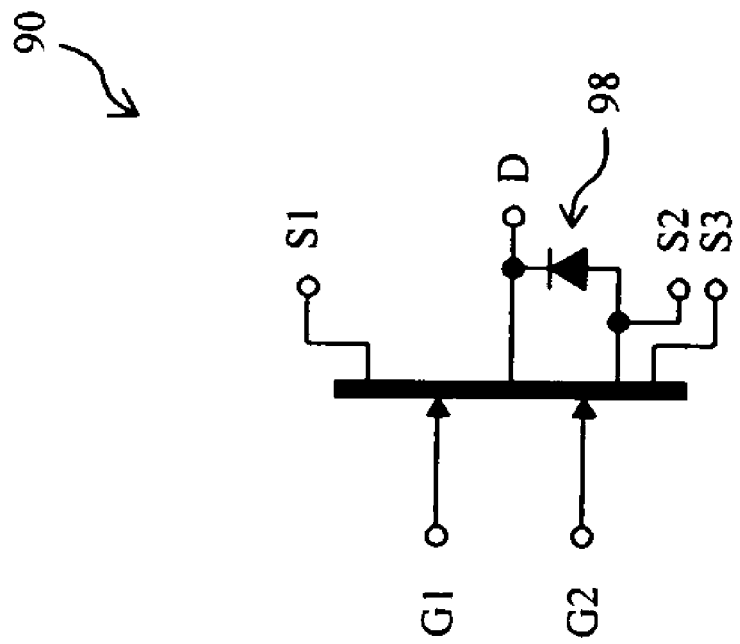
FIG. 17 shows a seventh embodiment of a single-chip common-drain JFET device according to the present invention.

FIG. 15 shows a single-chip common-drain JFET device 90 according to the present invention, which comprises a drain D, two separated gates G1 and G2, and three separated sources S1-S3 arranged such that three common-drain JFETs 92-96 are formed therewith, as shown in FIG. 16. Due to the common-drain and common-gate of the JFETs 94 and 96, the source currents at S2 and S3 will have a ratio the same as the size ratio of the JFETs 94 and 96. With the device 90, switching apparatus and precise current sense may be obtained. For other applications, as shown in FIG. 17, a diode 98 is coupled between the drain D and source S2 for a current sustained at the drain D when all the JFETs 92-96 turn off. A parasitic diode within the chip of the device 90 may be used for the diode 98. In the device 90, all the JFETs 92-96 are depletion mode JFETs, in another embodiment, however, the JFETs 92-96 may be all enhancement mode JFETs, or the JFET 92 is a depletion mode JFET and the JFETs 94 and 96 are enhancement mode JFETs, or the JFET 92 is an enhancement mode JFETs and the JFETs 94 and 96 are depletion mode JFETs.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A switch comprising:
   a single-chip common-drain JFET device including:
      a first JFET and a second JFET,
      a drain coupled to an output, said drain being common to said first and second JFETs;
      a first gate;
      a first source coupled to a first voltage, wherein the first source in conjunction with the common drain and the first gate form said first JFET;
      a second gate; and
      a second source coupled to a second voltage different from said first voltage, wherein the second source in conjunction with the common drain and the second gate form said second JFET; and
   a controller providing a first control signal coupled to the first gate and a second control signal coupled to the second gate to switch the first and second JFETs between an ON and an OFF states thereof, thereby switching connection of the first and second voltages coupled to said first and second sources, respectively, to the output.

* * * * *